US012696434B2

(12) United States Patent
Otsubo et al.

(10) Patent No.: US 12,696,434 B2
(45) Date of Patent: Jul. 28, 2026

(54) MODULE

(71) Applicant: Murata Manufacturing Co., Ltd.,
Kyoto-fu (JP)

(72) Inventors: Yoshihito Otsubo, Nagaokakyo (JP);
Morio Takeuchi, Nagaokakyo (JP)

(73) Assignee: Murata Manufacturing Co., Ltd.,
Kyoto-fu (JP)

( * ) Notice: Subject to any disclaimer, the term of this
patent is extended or adjusted under 35
U.S.C. 154(b) by 216 days.

(21) Appl. No.: 18/672,815

(22) Filed: May 23, 2024

(65) Prior Publication Data

US 2024/0324158 A1     Sep. 26, 2024

Related U.S. Application Data

(63) Continuation of application No.
PCT/JP2022/038614, filed on Oct. 17, 2022.

(30) Foreign Application Priority Data

Nov. 25, 2021     (JP) .................................. 2021-191363

(51) Int. Cl.
*H05K 1/02*          (2006.01)
*H05K 9/00*          (2006.01)
(52) U.S. Cl.
CPC ......... *H05K 9/0081* (2013.01); *H05K 1/0233*
(2013.01)
(58) Field of Classification Search
CPC ......... H01L 25/00; H01L 25/04; H01L 25/18;
H05K 1/02; H05K 1/0233; H05K 1/14;
H05K 3/46; H05K 9/0081; H05K 9/00
USPC ....................................................... 361/818
See application file for complete search history.

(56) References Cited

U.S. PATENT DOCUMENTS

| | | | |
|---|---|---|---|
| 10,468,384 B2 | 11/2019 | Yang et al. | |
| 2005/0168961 A1 | 8/2005 | Ono et al. | |
| 2007/0221399 A1* | 9/2007 | Nishizawa ........... | H05K 1/0218 |
| | | | 174/250 |

(Continued)

FOREIGN PATENT DOCUMENTS

| | | | | |
|---|---|---|---|---|
| JP | 2001-111232 A | 4/2001 | | |
| JP | 2001267710 A | * 9/2001 | ............... | H05K 1/14 |

(Continued)

OTHER PUBLICATIONS

International Search Report for PCT/JP2022/038614 dated Dec. 27, 2022.

*Primary Examiner* — Timothy J Thompson
*Assistant Examiner* — Guillermo J Egoavil
(74) *Attorney, Agent, or Firm* — McDonald Hopkins LLC

(57)          ABSTRACT

A module includes: a first substrate having a first surface and a second surface facing opposite sides; and a second substrate having a third surface and a fourth surface facing opposite sides, wherein the second substrate is disposed to overlap the first substrate with the third surface facing the first substrate, while being spaced apart from the first substrate on the second surface side of the first substrate, the first substrate and the second substrate are electrically connected, an inductor is mounted on the third surface, and at least one shield electrode is fixed to the first substrate with the shield electrode being positioned so as to cross a path of a magnetic flux, and each of the at least one shield electrode is grounded.

6 Claims, 6 Drawing Sheets

(56)  References Cited

U.S. PATENT DOCUMENTS

2009/0135575 A1      5/2009  Kajiki et al.
2012/0062040 A1*    3/2012  Kaeriyama ......... H10W 20/497
                                                                    307/104
2019/0363030 A1*  11/2019  Yazaki ................... B32B 38/04

FOREIGN PATENT DOCUMENTS

JP                4186843   B2    11/2008
JP                5230997   B2     7/2013
WO      2018/051858  A1     3/2018
WO      2018/155162  A1     8/2018

* cited by examiner

MODULE

CROSS REFERENCE TO RELATED APPLICATION

This is a continuation of International Application No. PCT/JP2022/038614 filed on Oct. 17, 2022 which claims priority from Japanese Patent Application No. 2021-191363 filed on Nov. 25, 2021. The contents of these applications are incorporated herein by reference in their entireties.

BACKGROUND OF THE DISCLOSURE

Field of the Disclosure

The present disclosure relates to a module.

Description of the Related Art

U.S. Pat. No. 10,468,384 B2 (PTL 1) discloses a structure in which two substrates are overlapped with each other in a state of being spaced apart from each other and bonded to each other by a conductive pillar, and a component is mounted on one of the substrates between the two substrates.

PTL 1: U.S. Pat. No. 10,468,384 B2

BRIEF SUMMARY OF THE DISCLOSURE

In PTL 1, the component is mounted on a surface of each substrate between the two substrates disposed in a state of being spaced apart from each other and facing each other. However, interference caused by electromagnetic waves between the components is not taken into consideration.

Accordingly, a possible benefit of the present disclosure is to provide a module with the enhanced performance of shielding a component mounted on a surface of one substrate between two substrates disposed in a state of being spaced apart from each other and facing each other.

In order to achieve the above-described possible benefit, a module based on the present disclosure includes: a first substrate having a first surface and a second surface facing opposite sides; and a second substrate having a third surface and a fourth surface facing opposite sides, wherein the second substrate is disposed to overlap the first substrate with the third surface facing the first substrate, while being spaced apart from the first substrate on the second surface side of the first substrate, the first substrate and the second substrate are electrically connected, an inductor is mounted on the third surface, and at least one shield electrode is fixed to the first substrate with the shield electrode being positioned so as to cross a path of a magnetic flux emitted by the inductor, and each of the at least one shield electrode is grounded.

According to the present disclosure, the at least one shield electrode is fixed to the first substrate with the shield electrode being positioned so as to cross the path of the magnetic flux emitted by the inductor, and thus, the shield performance can be enhanced. That is, it is possible to realize a module with the enhanced performance of shielding a component mounted on a surface of one substrate between two substrates disposed in a state of being spaced apart from each other and facing each other.

DETAILED DESCRIPTION OF THE DISCLOSURE

Figure 1:
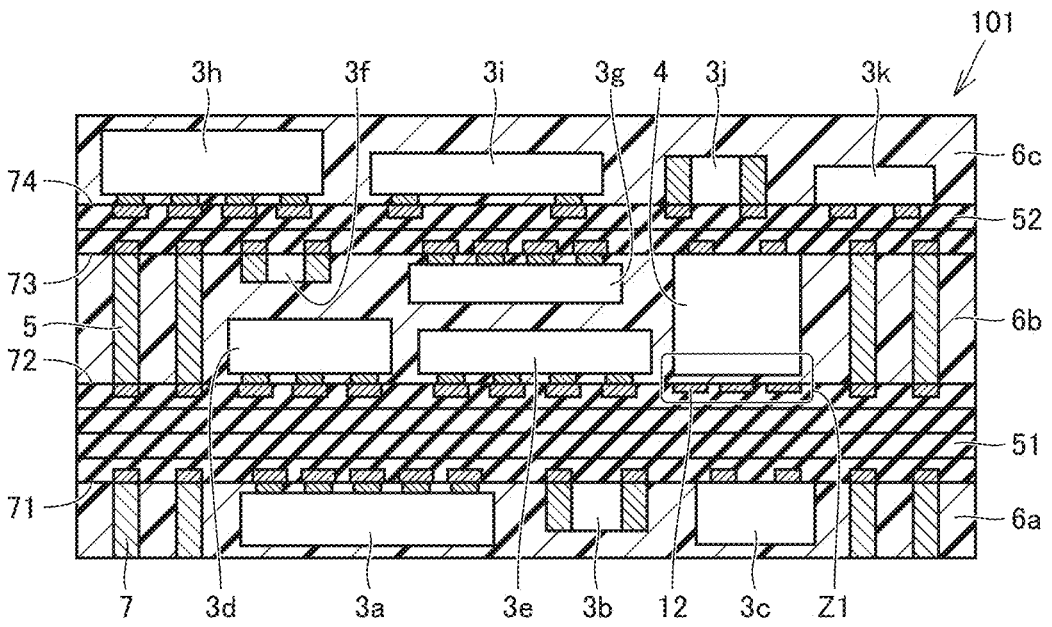
FIG. 1 is a cross-sectional view of a module according to a first embodiment based on the present disclosure.

A dimensional ratio shown in the drawings does not necessarily faithfully represent an actual dimensional ratio and a dimensional ratio may be exaggerated for the sake of convenience of description. A concept up or upper or down or lower mentioned in the description below does not mean absolute up or upper or down or lower but may mean relative up or upper or down or lower in terms of a shown position.

First Embodiment

A module according to a first embodiment based on the present disclosure will be described with reference to FIGS. 1 and 2. FIG. 1 shows a cross-sectional view of a module 101 according to the present embodiment. Module 101 includes a first substrate 51 and a second substrate 52. First substrate 51 has a first surface 71 and a second surface 72 facing opposite sides. Second substrate 52 has a third surface 73 and a fourth surface 74 facing opposite sides. Second substrate 52 is disposed to overlap first substrate 51 with third surface 73 facing first substrate 51, while being spaced apart from first substrate 51 on the second surface 72 side of first substrate 51. First substrate 51 and second substrate 52 are electrically connected. An inductor 4 is mounted on third surface 73. In the example shown here, a direction of a central axis of a magnetic flux generated from inductor 4 is perpendicular to third surface 73. At least one shield electrode 12 is fixed to first substrate 51 with shield electrode 12 being positioned so as to cross a path of the magnetic flux emitted by inductor 4. As an example of "at least one shield electrode 12" as used herein, three shield electrodes 12 are disposed. The number of "at least one shield electrode 12"

may of course be the number other than three. That is, the number of shield electrodes 12 may be one, two, or more than three. Each of "at least one shield electrode 12" is grounded by a not-shown wire.

Components 3a, 3b and 3c are mounted on first surface 71 of first substrate 51. A columnar conductor serving as an external terminal 7 is provided to stand on first surface 71 of first substrate 51. Components 3a, 3b and 3c are covered with a sealing resin 6a. A lower end of external terminal 7 is exposed at a lower surface of module 101 without being covered with sealing resin 6a. The exposed surface of the lower end of external terminal 7 may be covered with a not-shown plating film.

Components 3d and 3e are mounted on second surface 72 of first substrate 51. In addition to inductor 4, components 3f and 3g are mounted on third surface 73 of second substrate 52. A columnar conductor 5 is disposed to connect second surface 72 of first substrate 51 and third surface 73 of second substrate 52. Electrical connection between first substrate 51 and second substrate 52 is implemented by columnar conductor 5. Between first substrate 51 and second substrate 52, components 3d, 3e, 3f, and 3g and columnar conductor 5 are sealed by a sealing resin 6b.

Components 3h, 3i, 3j, and 3k are mounted on fourth surface 74 of second substrate 52. Components 3h, 3i, 3j, and 3k are covered with a sealing resin 6c.

A Z1 portion in FIG. 1 will be described. FIG. 2 shows shield electrodes 12 in the Z1 portion when viewed from a direction perpendicular to second surface 72. In order to show the positional relationship between inductor 4 and shield electrodes 12, an outer shape of inductor 4 is indicated by a dot-dot-dash line in FIG. 2. Here, on second surface 72, three shield electrodes 12 are disposed to cross a projection area of inductor 4. Shield electrodes 12 are strip-shaped conductors disposed on second surface 72. Since the case in which the number of shield electrodes 12 is three is shown here as an example, three shield electrodes 12 are disposed in parallel. However, even when the number of shield electrodes 12 is two or more than three, shield electrodes 12 may similarly be disposed in parallel.

In the present embodiment, at least one shield electrode 12 is fixed to first substrate 51 with shield electrode 12 being positioned so as to cross the path of the magnetic flux emitted by inductor 4, and thus, the shield performance can be enhanced. For example, a signal line may in some cases be disposed in first substrate 51. In this case, by providing shield electrodes 12 on second surface 72 of first substrate 51, interference with the signal line in first substrate 51 due to the magnetic flux emitted by inductor 4 can be suppressed. That is, it is possible to realize a module with the enhanced performance of shielding a component mounted on a surface of one substrate between two substrates disposed in a state of being spaced apart from each other and facing each other. In the present embodiment, it is possible to achieve a reduction in area and height, while increasing the component mounting density of module 101.

As described in the present embodiment, it is preferable that inductor 4 should be disposed such that the magnetic flux emitted by inductor 4 is perpendicular to third surface 73, and at least one shield electrode 12 described above should be disposed to cover a part of second surface 72. Employing this configuration allows at least one shield electrode 12 described above to efficiently perform shielding against inductor 4.

Figure 2:
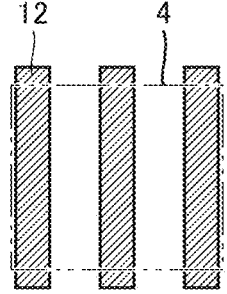
FIG. 2 is an enlarged plan view of a Z1 portion in FIG. 1.

As shown in FIG. 2 of the present embodiment, it is preferable that at least one shield electrode 12 described above should be a plurality of strip-shaped conductors disposed in parallel with each other. That is, it is preferable that at least one shield electrode 12 described above should be conductors disposed in a stripe pattern. Employing this configuration allows shield electrodes 12 to be disposed to cover a desired region while suppressing the occurrence of an eddy current.

Figure 3:
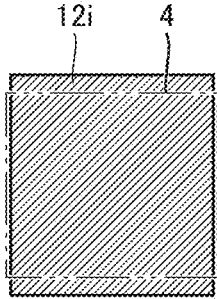
FIG. 3 is an explanatory diagram of a first modification of a shield electrode provided in the module according to the first embodiment based on the present disclosure.

Instead of shield electrodes 12 shown in FIG. 2, even a shield electrode such as a shield electrode 12i shown in FIG. 3 produces a certain effect. Shield electrode 12i is a plate-shaped electrode. Shield electrode 12i is disposed to almost overlap the projection area of inductor 4. However, in the case of a conductor having a large two-dimensional extent, such as shield electrode 12i, a loop path can be drawn inside shield electrode 12i, and thus, an eddy current is likely to occur in shield electrode 12i due to an influence of the magnetic flux emitted by inductor 4. In order to suppress the occurrence of the eddy current, the configuration such as shield electrodes 12 shown in FIG. 2 is preferable.

Figure 4:
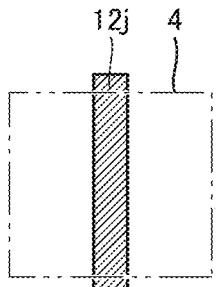
FIG. 4 is an explanatory diagram of a second modification of the shield electrode provided in the module according to the first embodiment based on the present disclosure.

A shield electrode such as a shield electrode 12j shown in FIG. 4 is also conceivable. Shield electrode 12j is a single strip-shaped conductor disposed to cross the projection area of inductor 4. Although disposing a plurality of strip-shaped conductors as in shield electrodes 12 shown in FIG. 2 produces a more advantageous effect, even one strip-shaped conductor produces a certain effect.

First Modification

Figure 5:
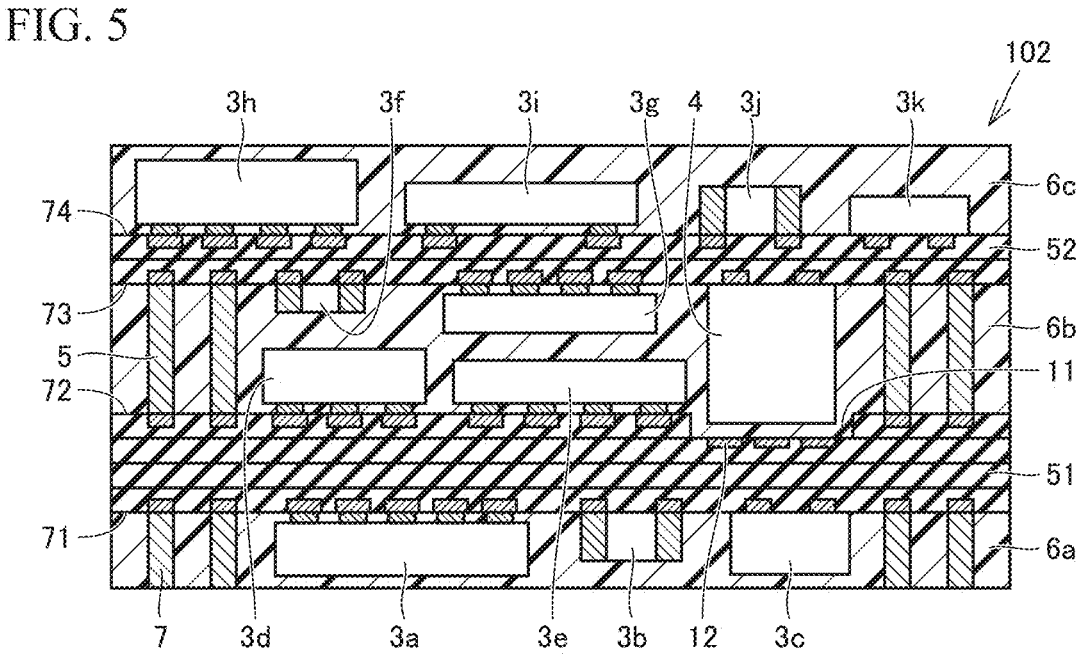
FIG. 5 is a cross-sectional view of a first modification of the module according to the first embodiment based on the present disclosure.

FIG. 5 shows a first modification of the module according to the present embodiment. In a module 102, first substrate 51 has a recessed portion 11 in second surface 72. A part of inductor 4 enters recessed portion 11. Recessed portion 11 is provided at a position that faces inductor 4 in second surface 72 of first substrate 51. Shield electrodes 12 are disposed on a bottom surface of recessed portion 11. A lower end of inductor 4 enters the inside of recessed portion 11. Since employing this configuration also allows a distance between first substrate 51 and second substrate 52 to be made smaller than a height of inductor 4, a reduction in height can be achieved.

Second Modification

Figures 6, 7:
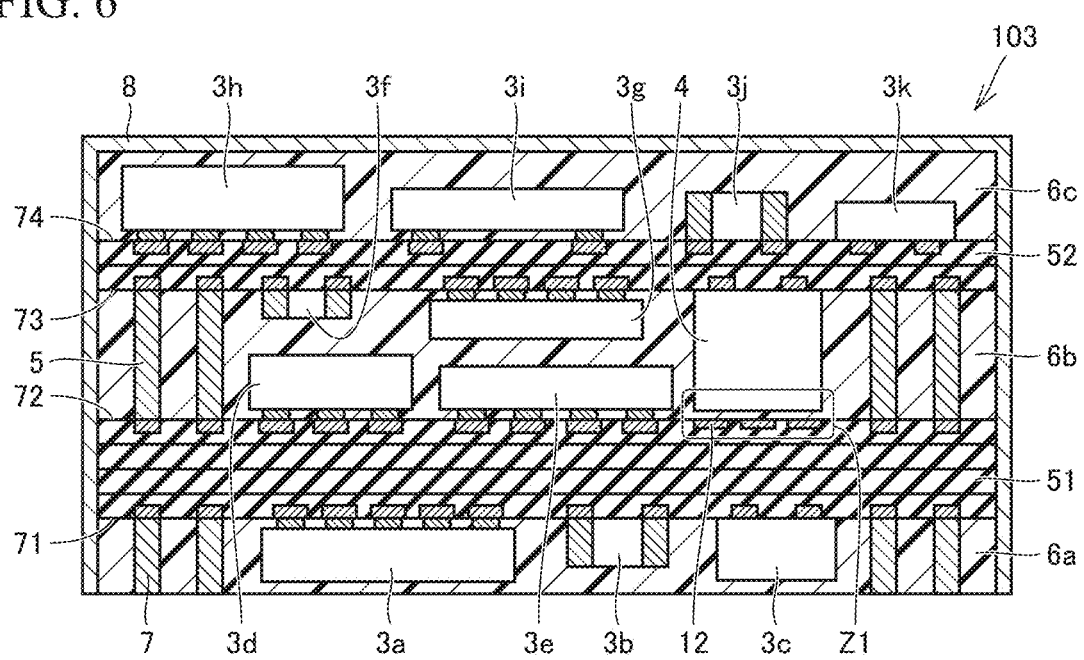
FIG. 6 is a cross-sectional view of a second modification of the module according to the first embodiment based on the present disclosure.
FIG. 7 is a cross-sectional view of a module according to a second embodiment based on the present disclosure.

FIG. 6 shows a second modification of the module according to the present embodiment. In a module 103, the whole of side surfaces and an upper surface are covered with a shield film 8. Shield film 8 is a conductor film. The remaining configuration is the same as that of module 101 shown in FIG. 1. Employing this configuration allows more reliable shielding of the whole of module 103 from the outside, and thus, the shield performance can be enhanced.

Second Embodiment

A module according to a second embodiment based on the present disclosure will be described with reference to FIGS. 7 and 8. FIG. 7 shows a cross-sectional view of a module 104 according to the present embodiment. Instead of inductor 4, module 104 includes an inductor 4n. Inductor 4n is mounted on third surface 73 of second substrate 52. Inductor 4n is disposed such that a magnetic flux emitted by inductor 4n is parallel to third surface 73. At least one shield electrode 13 is disposed to stand vertically on second surface 72. Each of at least one shield electrode 13 described above is grounded. The remaining configuration is the same as that described in the first embodiment.

Figure 8:
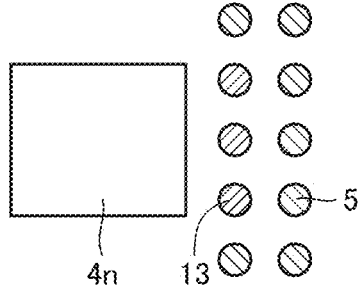
FIG. 8 is an enlarged plan view of a Z2 portion in FIG. 7.

FIG. 8 shows a Z2 portion in FIG. 7 when viewed in a plan view. Here, the magnetic flux emitted by inductor 4n occurs in a direction perpendicular to the direction in which shield electrodes 13 are disposed to stand, i.e., a right-left direction in FIG. 8. Three shield electrodes 13 are arranged along a side surface of inductor 4n. In module 104, columnar conductors 5 serving as signal lines are disposed at an outer edge portion. Shield electrodes 13 are arranged to separate columnar conductors 5 serving as signal lines from inductor 4n.

In the present embodiment, at least one shield electrode 13 is fixed to first substrate 51 with shield electrode 13 being positioned so as to cross a path of the magnetic flux emitted by inductor 4n, and thus, the performance of shielding from the magnetic flux emitted by inductor 4n can be enhanced. Since columnar conductors 5 serving as signal lines are separated from inductor 4n by a line of shield electrodes 13, columnar conductors 5 are protected from the magnetic flux emitted by inductor 4n.

First Modification

Figure 9:
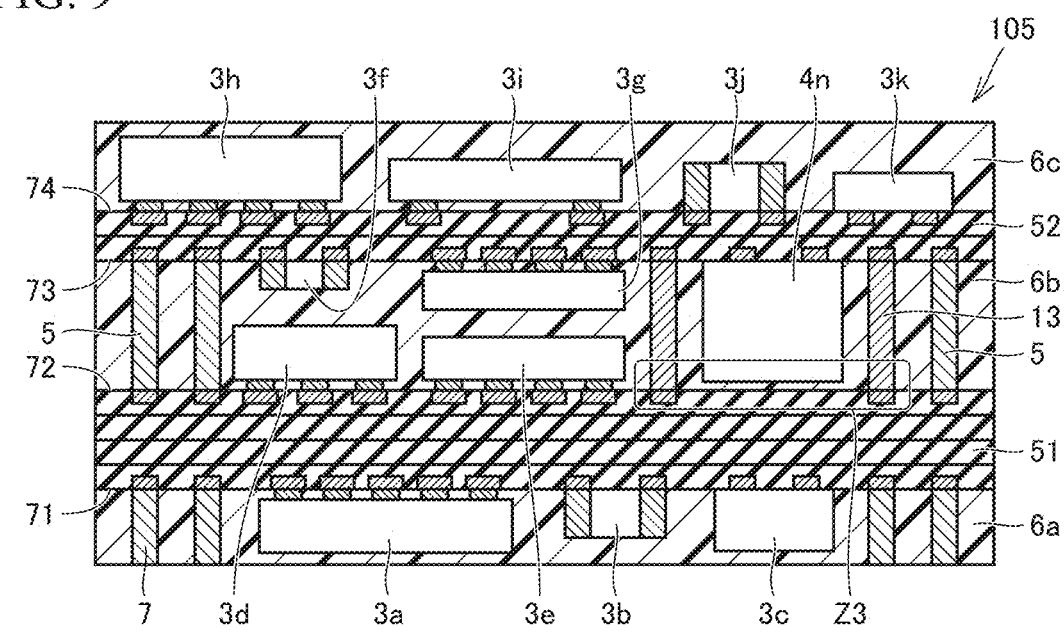
FIG. 9 is a cross-sectional view of a first modification of the module according to the second embodiment based on the present disclosure.
Figure 10:
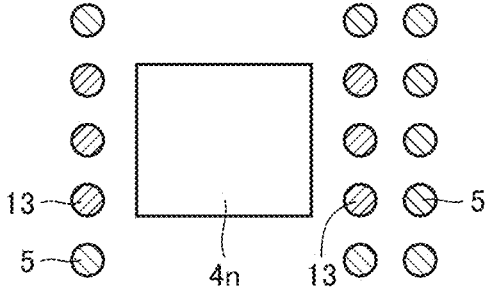
FIG. 10 is an enlarged plan view of a Z3 portion in FIG. 9.

FIG. 9 shows a first modification of the module according to the present embodiment. FIG. 10 shows a Z3 portion in FIG. 9 when viewed in a plan view. In a module 105, the magnetic flux is emitted from right and left side surfaces of inductor 4n, and the magnetic flux runs in a right-left direction connecting the left side surface and the right side surface. Shield electrodes 13 serving as columnar conductors are arranged along each of the left side surface and the right side surface of inductor 4n in FIG. 10. That is, inductor 4n is sandwiched by the lines of shield electrodes 13. As described here, it is preferable that at least one shield electrode 13 described above should be a plurality of columnar conductors disposed in parallel with each other, and the plurality of columnar conductors described above should be disposed along the two parallel side surfaces of inductor 4n from which the magnetic flux is emitted. Employing this configuration allows further suppression of an influence of the magnetic flux emitted by inductor 4n on the surroundings. Since the line of shield electrodes 13 is also disposed between components 3e and 3g and inductor 4n, the shield performance can be further enhanced. Columnar conductors 5 located around shield electrodes 13 are signal lines.

Second Modification

Figure 11:
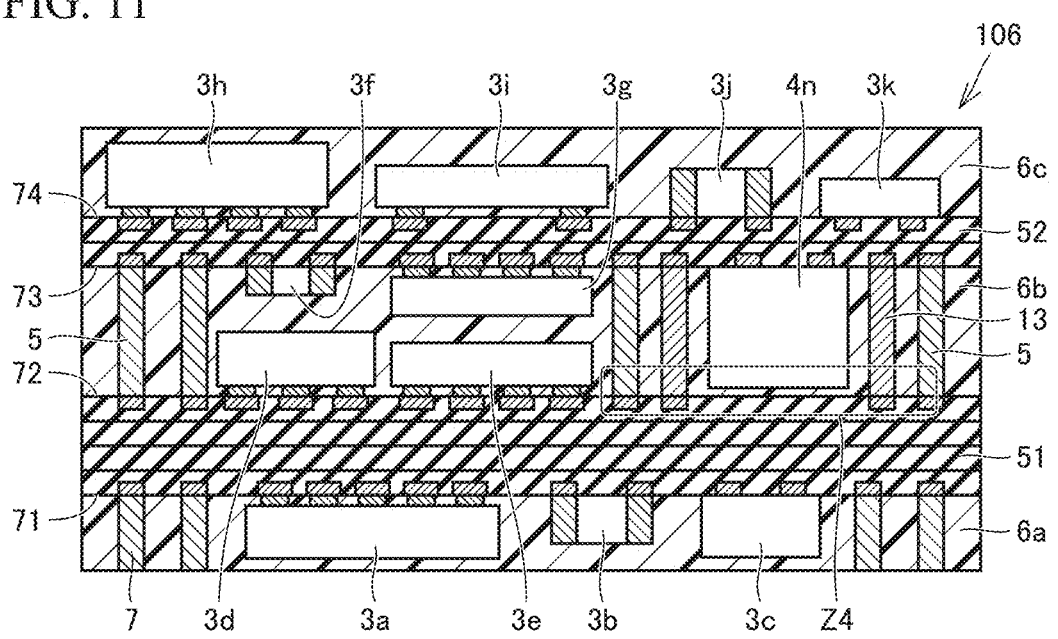
FIG. 11 is a cross-sectional view of a second modification of the module according to the second embodiment based on the present disclosure.
Figure 12:
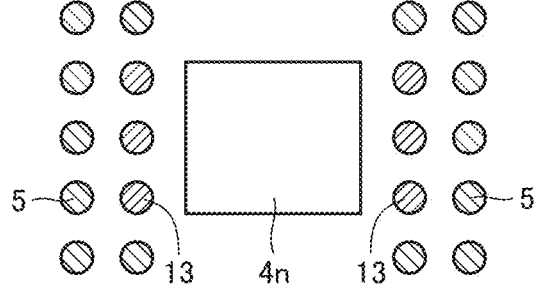
FIG. 12 is an enlarged plan view of a Z4 portion in FIG. 11.

FIG. 11 shows a second modification of the module according to the present embodiment. FIG. 12 shows a Z4 portion in FIG. 11 when viewed in a plan view. Similarly to module 105, a module 106 includes inductor 4n. The direction of the magnetic flux line generated from inductor 4n is the same as that described regarding module 105. In module 106, columnar conductors 5 serving as signal lines are disposed to sandwich inductor 4n. However, shield electrodes 13 are arranged between columnar conductors 5 serving as signal lines and inductor 4n. As shown in FIG. 12, inductor 4n is sandwiched by the lines of shield electrodes 13, and further, is sandwiched by the lines of columnar conductors 5 outside the lines of shield electrodes 13. Employing this configuration allows further enhancement of the shield performance, because columnar conductors 5 serving as signal lines and inductor 4n are separated by the lines of shield electrodes 13 even when columnar conductors 5 are disposed around inductor 4n.

Third Modification

Figure 13:
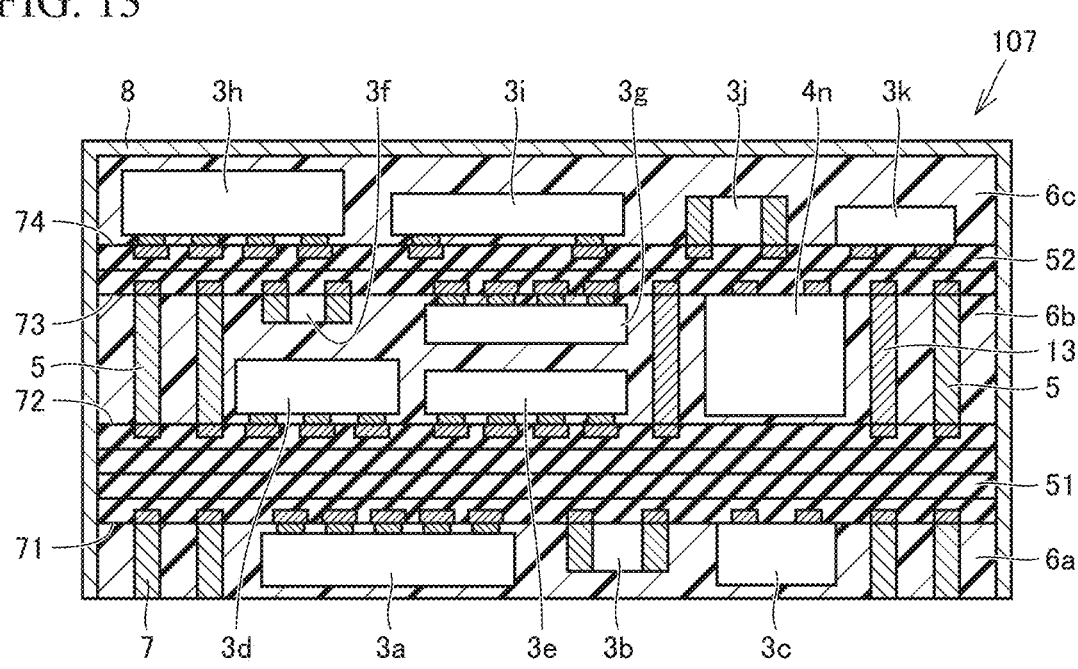
FIG. 13 is a cross-sectional view of a third modification of the module according to the second embodiment based on the present disclosure.

FIG. 13 shows a third modification of the module according to the present embodiment. In a module 107, the whole of side surfaces and an upper surface are covered with shield film 8. Shield film 8 is a conductor film. The remaining configuration is the same as that of module 105 shown in FIG. 9. Employing this configuration allows more reliable shielding of the whole of module 107 from the outside, and thus, the shield performance can be enhanced.

As shown in FIG. 13 as the third modification, it is preferable that module 107 should include columnar conductor 5 serving as a signal line disposed to connect first substrate 51 and second substrate 52, an intermediate sealing resin that seals a space between first substrate 51 and second substrate 52, and shield film 8 that covers at least a side surface of the intermediate sealing resin, and the signal line should be sandwiched between shield electrodes 13 serving as the plurality of columnar conductors and shield film 8. "Intermediate sealing resin" as used herein is sealing resin 6b. The columnar conductor serving as a signal line disposed in a state of being sealed by sealing resin 6b is sandwiched between shield electrodes 13 and shield film 8. Employing this configuration allows enhancement of the performance of shielding the columnar conductor serving as a signal line.

As described in the second embodiment, it is preferable that at least one shield electrode 13 described above should be at least one columnar conductor disposed to connect first substrate 51 and second substrate 52. Employing this configuration allows shield electrode 13 to extend over the entire area between first substrate 51 and second substrate 52. Alternatively, shield electrode 13 may be configured to be connected to first substrate 51 and not to be connected to second substrate 52. Even in this case, a certain shielding effect can be obtained. Shield electrode 13 may be spaced apart from second substrate 52.

Fourth Modification

Figure 14:
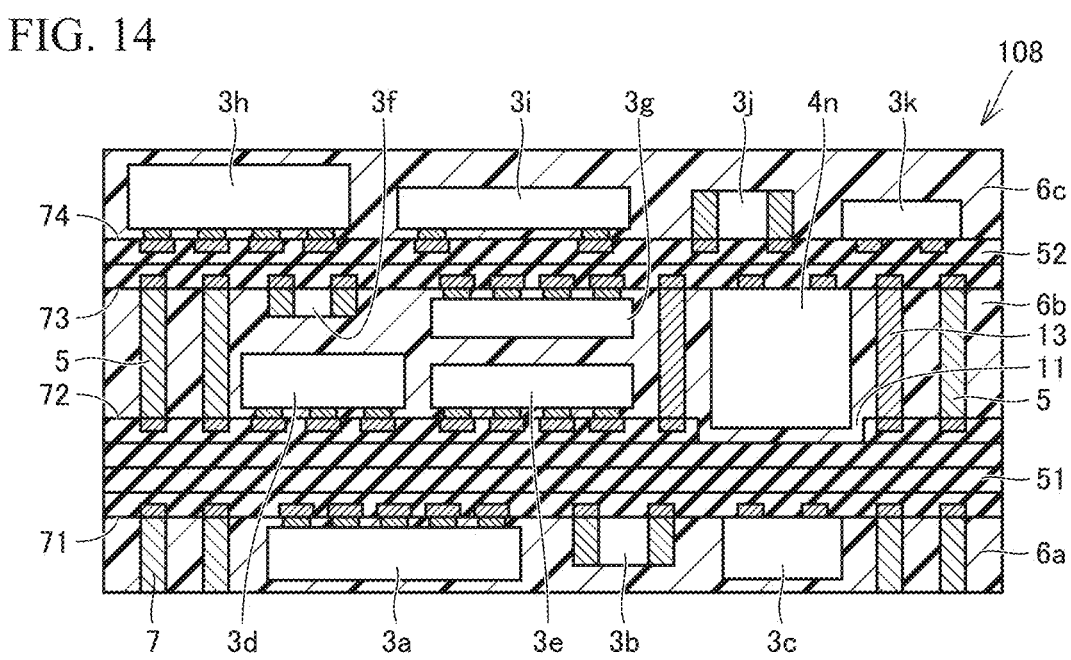
FIG. 14 is a cross-sectional view of a fourth modification of the module according to the second embodiment based on the present disclosure.

FIG. 14 shows a fourth modification of the module according to the present embodiment. In a module 108, first substrate 51 has recessed portion 11 in second surface 72. A part of inductor 4n enters recessed portion 11. Recessed portion 11 is provided at a position that faces inductor 4n in second surface 72 of first substrate 51. A lower end of inductor 4n enters the inside of recessed portion 11. Since employing this configuration also allows a distance between first substrate 51 and second substrate 52 to be made smaller than a height of inductor 4n, a reduction in height can be achieved.

Among the above-described embodiments, a plurality of embodiments may be employed in an appropriate combination.

Note that the above-described embodiments disclosed herein are illustrative and non-restrictive in every respect. The scope of the present disclosure is defined by the scope of the claims, and is intended to include any modifications within the meaning and scope equivalent to the scope of the claims.

3a, 3b, 3c, 3d, 3c, 3f, 3g, 3h, 3i, 3j, 3k component; 4, 4n inductor; 5 columnar conductor; 6a, 6b, 6c sealing resin; 7 external terminal; 8 shield film; 11 recessed portion; 12, 12i, 12j, 13 shield electrode; 51 first substrate; 52 second substrate; 71 first surface; 72 second surface; 73 third surface; 74 fourth surface; 101, 102, 103, 104, 105, 106, 107, 108 module.

The invention claimed is:
1. A module comprising:
a first substrate having a first surface and a second surface facing away from each other;

a second substrate having a third surface and a fourth surface facing away from each other;

a signal line disposed to connect the first substrate and the second substrate;

an intermediate sealing resin sealing a space between the first substrate and the second substrate; and a shield film covering at least a side surface of the intermediate sealing resin, wherein the second substrate is disposed to overlap the first substrate with the third surface facing the first substrate while the second substrate is spaced from the first substrate on a side of the second surface of the first substrate, the first substrate and the second substrate are electrically connected, an inductor is mounted on the third surface, at least one shield electrode is fixed to the first substrate with the shield electrode being positioned so as to cross a path of a magnetic flux emitted by the inductor, and each of the at least one shield electrode is grounded, the inductor is disposed such that the magnetic flux emitted by the inductor is parallel to the third surface, and the at least one shield electrode is disposed to stand vertically on the second surface, the at least one shield electrode is a plurality of columnar conductors disposed in parallel with each other, and the plurality of columnar conductors are disposed along two parallel side surfaces of the inductor from which the magnetic flux is emitted, and the signal line is sandwiched between the plurality of columnar conductors and the shield film.

2. The module according to claim 1, wherein the at least one shield electrode is disposed to connect the first substrate and the second substrate.

3. The module according to claim 1, wherein the at least one shield electrode is a plurality of strip-shaped conductors disposed in parallel with each other.

4. The module according to claim 1, wherein the first substrate has a recessed portion in the second surface, and a part of the inductor enters the recessed portion.

5. The module according to claim 2, wherein the first substrate has a recessed portion in the second surface, and a part of the inductor enters the recessed portion.

6. The module according to claim 3, wherein the first substrate has a recessed portion in the second surface, and a part of the inductor enters the recessed portion.

* * * * *